(12) United States Patent
MacPherson

(10) Patent No.: US 7,187,123 B2
(45) Date of Patent: Mar. 6, 2007

(54) DISPLAY DEVICE

(75) Inventor: Charles Douglas MacPherson, Santa Barbara, CA (US)

(73) Assignee: DuPont Displays, Inc., Santa Barbara, CA (US)

( * ) Notice: Subject to any disclaimer, the term of this patent is extended or adjusted under 35 U.S.C. 154(b) by 101 days.

(21) Appl. No.: 11/134,168

(22) Filed: May 20, 2005

(65) Prior Publication Data

US 2006/0138947 A1    Jun. 29, 2006

Related U.S. Application Data

(63) Continuation-in-part of application No. 11/025,168, filed on Dec. 29, 2004, now abandoned.

(51) Int. Cl.
*H01J 1/62* (2006.01)
(52) U.S. Cl. ............... 313/506; 313/504; 257/E23.179; 257/797; 438/462; 438/401
(58) Field of Classification Search ........ 313/503–506, 313/512; 257/797, 678, E23.01, E23.179; 438/400, 401, 460, 462; 315/169.3
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 6,617,702 B2 | 9/2003 | Hsu et al. | |
| 6,636,001 B2* | 10/2003 | Kawai et al. | 315/169.3 |
| 6,661,098 B2 | 12/2003 | Magerlein et al. | |
| 6,664,483 B2 | 12/2003 | Chong et al. | |
| 7,084,081 B2* | 8/2006 | Goto | 438/795 |
| 2001/0016436 A1 | 8/2001 | Wimmer | |
| 2004/0256978 A1 | 12/2004 | Yu et al. | |
| 2005/0230678 A1* | 10/2005 | Cao et al. | 257/40 |

FOREIGN PATENT DOCUMENTS

JP    3-135595 A    8/1991

* cited by examiner

*Primary Examiner*—Haissa Philogene
(74) *Attorney, Agent, or Firm*—John H. Lamming

(57) ABSTRACT

An electronic device is provided that includes an organic panel, including a platform made of an electrically nonconductive material; a first electrode on the platform; an organic active layer on the first electrode; a second electrode on the organic active layer; and a first alignment structure, in addition, a driver panel is provided and includes a substrate; a driver circuit formed on the substrate; and a second alignment structure for coupling with the first alignment structure to position the organic panel and driver panel in substantial alignment, and to electrically couple the driver circuit to the organic active layer.

19 Claims, 6 Drawing Sheets

DISPLAY DEVICE

CROSS-REFERENCE TO RELATED APPLICATIONS

This application is a Continuation-In-Part of U.S. patent application Ser. No. 11/025,168 filed on Dec. 29, 2004, now abandoned.

STATEMENT AS TO FEDERALLY SPONSORED RESEARCH

This invention was made with Government support under DARPA grant number 4332. The Government may have certain rights in the invention.

FIELD OF THE INVENTION

This invention relates generally to electronic devices and more specifically to interchangeable organic electronic devices.

BACKGROUND INFORMATION

Electronic devices are used in various applications, including, for example, displays. Displays made with organic materials are useful for battery-powered, portable electronic devices (e.g., cell phones, personal digital assistants, handheld personal computers, and DVD players) and also for desktop or wall-mounted television screens and computer monitors. The displays for these applications may require high information content, full color (FC), fast video rate response, and low power consumption.

Electronic devices, such as an organic light emitting diode (OLED), may be used in the above displays. An OLED includes a mulit-layered structure formed on a substrate. The multi-layered structure contains a layer with a driver circuit and at least one layer that contains an organic active material. As the layers may be sensitive to environmental elements such as moisture, dust, and oxygen, an encapsulation cap may be used to enclose and protect the layers from these elements.

A device containing both an electronic layer and an organic active layer may be disadvantageous from a cost standpoint, as the lifetime of organic electronic devices is limited, and the cost of manufacturing and repair is high.

There remains a need for lower cost organic electronic devices.

SUMMARY OF THE INVENTION

In one embodiment, an electronic device is provided that includes an organic panel, including a platform made of an electrically nonconductive material; a first electrode on the platform; an organic active layer on the first electrode; a second electrode on the organic active layer; and a first alignment structure, in addition, a driver panel includes a substrate; a driver circuit formed on the substrate; and a second alignment structure for coupling with the first alignment structure, wherein the first and second alignment structures are coupled to position the organic panel and driver panel in substantial alignment, and wherein the driver circuit is electrically coupled to the organic active layer.

In another embodiment, an electronic device is provided, including an organic panel, which includes a platform made of an electrically nonconductive material and having a thickness; a first electrode and a second electrode disposed on the platform; an organic active layer positioned between the first electrode and the second electrode and capable of receiving current flowing between the first electrode and the second electrode; and first vias extending through the thickness of the platform, wherein the first vias are filled with an electrically conductive material that is electrically coupled to the second electrode; in addition, a driver panel removably sealed to the organic panel, including a substrate; and a driver circuit formed on the substrate, wherein electrical signals are transmitted from the driver circuit to the organic layer through the first vias filled with the electrically conductive material.

In another embodiment, a organic panel is provided, including an electrically nonconductive platform having a first surface and a second surface; a first electrode on the first surface of the platform; an organic active layer on the first electrode; a second electrode on the organic active layer; a via extending through the platform from the first surface to the second surface; and an alignment structure formed on the platform for positioning the device in substantial alignment with another device.

In another embodiment, a driver panel is provided, for being mated with an organic member to form an electronic device, the driver panel includes a substrate; transistors formed on the substrate; a mating plate coupled to the transistors, the mating plate having vias extending therethrough wherein the positions of the vias substantially correspond to the positions of the transistors and are filled with an electrically conductive material; and an alignment structure formed on the mating plate.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
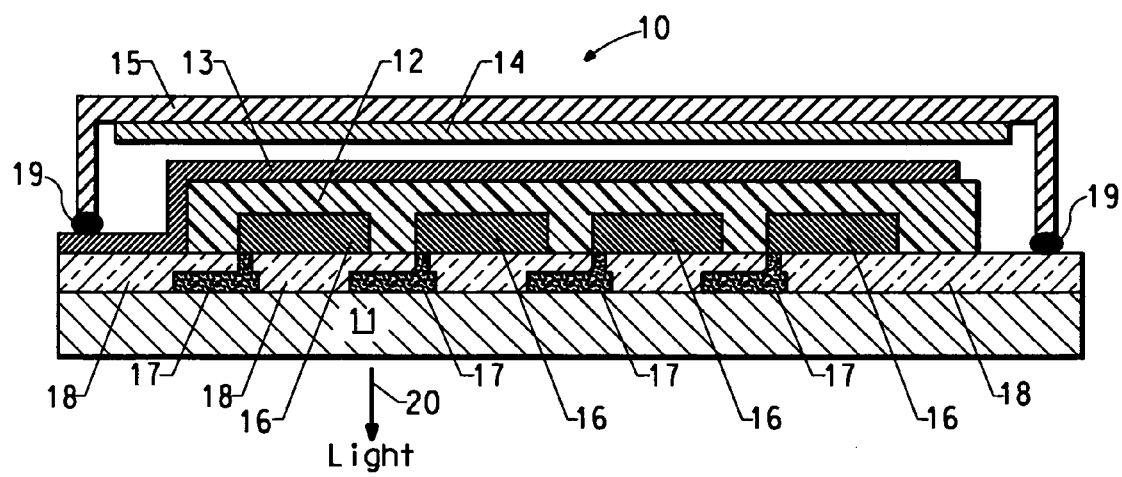
FIG. 1 is a schematic cross-sectional view of a display panel.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range. It is to be understood that the elements in the figures are not necessarily drawn to scale. For example, the dimensions of some of the elements in the figures may be exaggerated relative to other elements to assist in an understanding of the embodiments of the invention.

DETAILED DESCRIPTION

Other features and advantages of the invention will be apparent from the following detailed description, and from the claims.

In one embodiment, an electronic device is provided that includes an organic panel, including a platform made of an electrically nonconductive material; a first electrode on the platform; an organic active layer on the first electrode; a second electrode on the organic active layer; and a first alignment structure, in addition, a driver panel includes a substrate; a driver circuit formed on the substrate; and a second alignment structure for coupling with the first alignment structure, wherein the first and second alignment structures are coupled to position the organic panel and driver panel in substantial alignment, and wherein the driver circuit is electrically coupled to the organic active layer. The organic panel also may include a via extending through the platform; and an electrically conductive material in the via. The platform may include a view enhancing sheet. A view enhancing sheet may also be positioned between the organic panel and the driver panel. The organic panel may further include a plurality of first electrodes; and a plurality of pixels, wherein each of a pixel in the plurality of pixels includes at least two subpixels. The driver panel may further include a mating plate coupled to the driver circuit, comprising a via extending therethrough; and an electrically conductive material in the via, wherein the electrically conductive material electrically couples the driver circuit to the organic panel; and wherein the second alignment structure is formed on the mating plate. The second alignment structure may also be formed on the substrate. The first and second alignment structures may include one or more of a recess, a groove, a protrusion, and a fiducial. The organic panel and the driver panel are substantially in alignment by using a member that cooperates with the first and the second alignment structures to align the organic panel and driver panel. The first and the second alignment structures may include first and second v-grooves, and the member is an elongated structure sandwiched between the first v-groove and the second v-groove. The organic active layer emits radiation in response to an electrical signal from the driver circuit, or may generate an electrical signal in response to radiation.

In another embodiment, an electronic device is provided, including an organic panel, which includes a platform made of an electrically nonconductive material and having a thickness; a first electrode and a second electrode disposed on the platform; an organic active layer positioned between the first electrode and the second electrode and capable of receiving current flowing between the first electrode and the second electrode; and first vias extending through the thickness of the platform, wherein the first vias are filled with an electrically conductive material that is electrically coupled to the second electrode; in addition, a driver panel removably sealed to the organic panel, including a substrate; and a driver circuit formed on the substrate, wherein electrical signals are transmitted from the driver circuit to the organic layer through the first vias filled with the electrically conductive material. The device may include a mating plate positioned between the platform and the driver circuit; second vias extending through the mating plate and filled with a conductive material; a first alignment structure formed on the platform; and a second alignment structure formed on the mating plate and positioned such that when the first and the second alignment structures are mated, the first vias and the second vias are substantially aligned.

In another embodiment, a organic panel is provided, including an electrically nonconductive platform having a first surface and a second surface; a first electrode on the first surface of the platform; an organic active layer on the first electrode; a second electrode on the organic active layer; a via extending through the platform from the first surface to the second surface; and an alignment structure formed on the platform for positioning the device in substantial alignment with another device. The alignment structure is selected from a group consisting of a groove, a protrusion, a recessed area, and a surface marking. An encapsulation layer may cover the organic panel. The platform may be flexible.

In another embodiment, a driver panel is provided, for being mated with an organic member to form an electronic device, the driver panel includes a substrate; transistors formed on the substrate; a mating plate coupled to the transistors, the mating plate having vias extending therethrough wherein the positions of the vias substantially correspond to the positions of the transistors and are filled with an electrically conductive material; and an alignment structure formed on the mating plate.

DEFINITIONS

Before addressing further details of the embodiments described below, various terms are herein defined.

As used herein, the terms "organic electronic device" or "electronic device" are intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronics process (e.g., a photodetector, a photoconductive cell, a photoresistor, a photoswitch, a phototransistor, a phototube, an infrared ("IR") detector, or a biosensor), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In one embodiment, the compositions are deposited to form electrically conductive or semiconductive layers which are used alone or in a combination of one or more electrodes, one or more electroactive components, one ore more photoactive components, or one or more bioactive components. As used herein, the terms "electroactive component", "photoactive component", or "bioactive component" refer to a component which exhibits the predetermined activity in response to a stimulus, such as an electromagnetic field, an electrical potential, solar energy radiation, biostimulation field, or any combination thereof.

The term "layer" is used interchangeably with the term "film" and refers to a coating covering a desired area. The term is not limited by size. The area can be as large as the entire device or as small as a specific functional area such as the actual visual display, or as small as a single sub-pixel. Layers and films can be formed by any conventional deposition technique, including vapor deposition and liquid deposition (continuous and discontinuous techniques) and thermal transfer. Continuous deposition techniques include, but are not limited to, spin coating, gravure coating, curtain coating, dip coating, slot-die coating, spray coating, and continouous nozzle coating. Discontinuous deposition techniques include, but are not limited to, ink jet printing, gravure printing, and screen printing.

The term "active" when referring to a layer or material is intended to mean a layer or material that exhibits electronic or electro-radiative properties. An active layer material may emit radiation or exhibit a change in concentration of electron-hole pairs when receiving radiation.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct connection between electronic component(s), circuit(s) or electronic component(s) or circuit(s) with switch(es) (e.g., transistor(s)) connected between them.

The term "substantially" is intended to mean largely but not necessarily wholly that which is specified.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). The term "on" as in A "on" B shall mean, either directly "on", i.e., A in physical contact with B, or A is indirectly in contact with B, through another material or layer.

An "organic panel" as used herein, is a section of an organic electronic device that contains at least one organic active layer. The organic panel may include driver circuitry for the organic electronic device.

A "driver panel" as used herein, is a section of an organic electronic device that contains drive circuitry for the organic electronic device. The driver panel may contain an organic active layer.

The term "driver circuit" is intended to mean a circuit configured to control a signal sent to an electronic component, another circuit, or a combination thereof.

As used herein, a layer of material being "on" a surface includes both the case where the layer is adjacent to the surface on which it is formed and the case where there are intervening layers between the layer being formed and the surface.

The phrase "positioned between A and B" is intended to mean that a component is either one of multiple elements or the only element physically separating A from B.

The terms "a" or "an" as used herein are to describe elements and components of the invention. This is done merely for convenience and to give a general sense of the invention. This description should be read to include one or at least one and the singular also includes the plural unless it is obvious that it is meant otherwise.

As used herein, a "substrate" or a "platform" is a base material that can be either rigid or flexible and may include one or more layers of one or more materials, which can include, but are not limited to, glass polymer, metal, ceramic, or combinations thereof. The reference point for a substrate is the beginning point of a process sequence. The substrate may or may not include electronic components, circuits, or conductive members.

An "alignment structure" is a physical object, such as a mechanism, an indentation, or a marking, that is useful for positioning one panel relative to another panel. Some non-limiting examples of an alignment structure include a v-groove, a protrusion, a recess, an indentation, and a fiducial. Where two panels with alignment structures are combined, the two alignment structures may be designed to lock together and/or fit together in a desired position. Where the two alignment structures are protrusions, the protrusions may be designed to lock together, for example, dove-tail connectors. Where the two alignment structures are a recess and a protrusion, they may be designed to fit together, keeping the two panels in position.

Two alignment structures may be designed to be held together by an additional member. For example, where the alignment structures are recesses or grooves formed on the surfaces that form an interface between two members, an elongated object may be used in conjunction with the alignment structures to position the panels. The cross section of the elongated object is suitably shaped to cooperate with the alignment structures and facilitate the coupling thereof. For example, where the two alignment structures are recesses, indentations, or v-grooves, a suitably shaped object sandwiched between the two panels will cooperate with the alignment structures for proper alignment of the panels. Where the alignment structures are grooves or recesses formed on surfaces other than the interface surfaces, the member may be some form of a clip or a frame that fits into the alignment structures and holds the two parts together.

The term "electrode" is intended to mean a member or structure configured to transport carriers within an electronic component. For example, an electrode may be an anode, a cathode, a capacitor electrode, a gate electrode, and so forth. An electrode may include a part of a transistor, a capacitor, a resistor, an inductor, a diode, an electronic component, a power supply, or any combination thereof.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductor laser, an optical switch, or the like. An electronic component does not include parasitic resistance (e.g., resistance of a wire) or parasitic capacitance (e.g., capacitive coupling between two conductors connected to different electronic components where a capacitor between the conductors is unintended or incidental).

A "transistor" may be any conventional switching element including but not limited to thin film transistors (TFTs) such as amorphous silicon TFTs, continuous grain silicon TFTs, low temperature polysilicon TFTs, and sequential lateral solidification silicon TFTs.

The term "thin-film transistor" or "TFT" is intended to mean a field-effect transistor in which at least a channel region of the field-effect transistor is not principally a portion of a base material of a substrate. In one embodiment, the channel region of a TFT includes amorphous silicon, polylcrystalline silicon, or a combination thereof.

A "via" is a cutout (e.g., a hole) extending through a layer of material.

A "view enhancing sheet" is a planar object having optical properties that affect the image viewed by a user of the electronic device, including but not limited to an optical polarizer.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three subpixels with the primary colors being in the red, green, and blue spectral regions. A monochromatic display may include pixels but no subpixels. A sensor array can include pixels that may or may not include subpixels.

A "mating plate" is a material, layer, member, or structure that is useful for connecting one panel with another. A suitable mating plate is made of a material, for example, an electrically nonconducting material such as glass, that protects driver circuits from mechanical forces and various environmental elements such as moisture, and is able to accommodate electrically conductive portions so that when two panels are coupled using a mating plate, electrical connection can be established between the two coupled panels. A mating plate may have an alignment structure formed thereon, although it is not so limited.

An "alignment position" is the position two or more components are placed in by their alignment structures.

To the extent not described herein, many details regarding specific materials, processing acts, and circuits are conventional and may be found in textbooks and other sources within the organic light-emitting diode display, photodetector, photovoltaic, and semiconductor arts.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

STRUCTURE OF THE ORGANIC ELECTRONIC DEVICE

Referring now to FIG. 1, a schematic cross-sectional view of a bottom-emitting OLED display panel 10 is illustrated. The display panel 10 includes a substrate 11, a pixel driver 17, an insulation layer 18, and a transparent electrode 16 formed on the substrate 11. The pixel driver 17 includes at least two transistors and a capacitor, and forms a pixel circuit with an organic active layer 12. The organic active layer 12 and a common electrode 13 are deposited on the transparent electrode 16 and the insulation layer 18. The layers are covered with an encapsulation cap 15, and a layer of getter 14 is positioned in the space between the encapsulation cap 15 and electrode 13. A sealant 19 is used to attach the encapsulation cap 15 and to prevent moisture and air from reaching the enclosed layers. When the pixel driver 17 activates an area of the organic active layer 12, light is emitted which is transmitted though the display panel 10 in the direction shown by an arrow 20.

Figure 2:
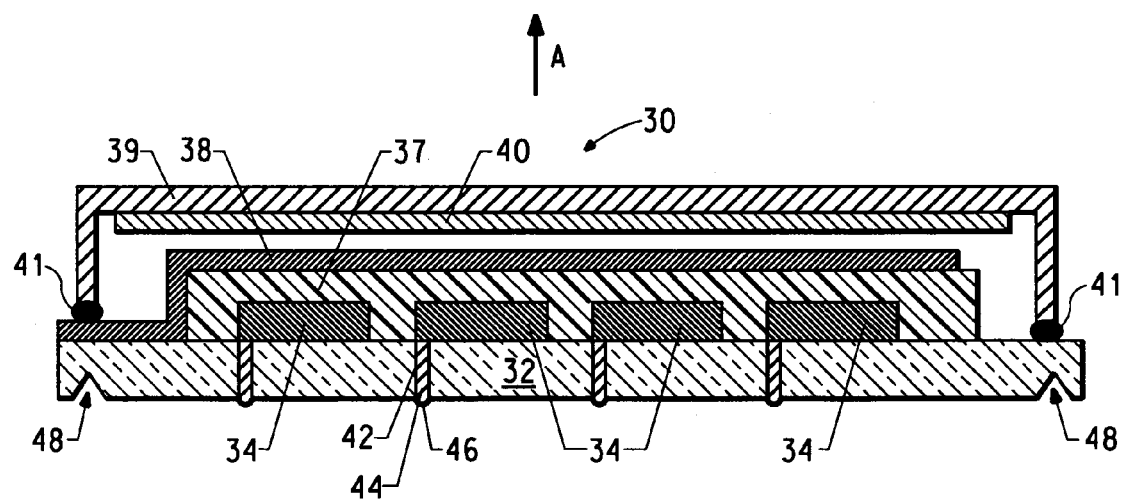
FIG. 2 is a schematic cross-sectional view of an embodiment of an organic panel.

FIG. 2 is a schematic cross-sectional view representing an embodiment of an organic panel according to an aspect of the invention. The organic panel 30 includes a platform 32 and first electrodes 34 formed on the platform 32. The first electrodes 34 are covered with an organic active layer 37 and a second electrode 38. An encapsulation cap 39 with a layer of getter 40 are placed over the second electrode 38, to protect the various layers from environmental elements and forces, and attached using a sealant 41. The organic active layer 37 may generate light which is transmitted from the organic panel 30 through the top surface in the direction of arrow A in FIG. 2, in which case both the second electrode 38 and the encapsulation cap 39 and layer of getter 40 are composed of transparent materials. The second electrode 38 may include a transparent conductive material such as indium tin oxide (ITO).

Each of the pixels (or subpixels) is associated with one of the first electrodes 34 such that when an electrical signal passes through one of a selected first electrode 34 and reaches the organic active layer 37, radiation is emitted by the pixel (or subpixel) that is associated with the selected first electrode 34.

The platform 32 has vias 42 therein, and a conductive material 44 fills the vias 42 and forms contact pads 46. The contact pads 46 may be solder bumps although not so limited. The platform 32 includes an alignment structure 48, which may consist of v-grooves as in the embodiment of FIG. 2.

Figure 3:
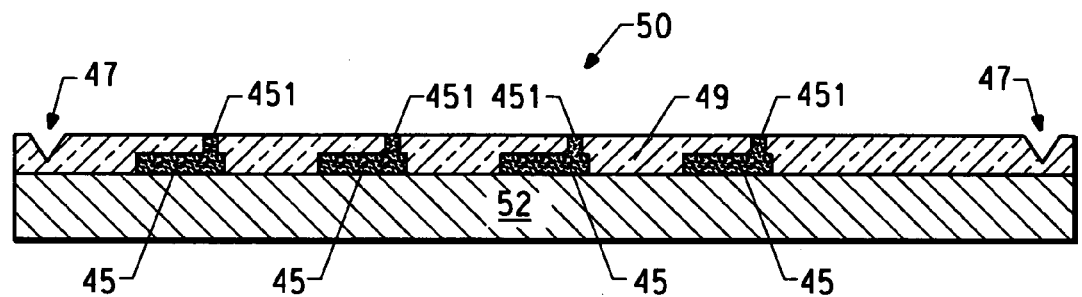
FIG. 3 is a schematic cross-sectional view of an embodiment of a driver panel.

FIG. 3 is a schematic cross-sectional view of an embodiment of a driver panel. The driver panel 50 includes a substrate 52 with transistors and other circuit elements that form pixel drivers 45 formed thereon. In one embodiment, the transistors for the pixel drivers 45 may be TFTs of any suitable type, including but not limited to amorphous silicon, continuous grain silicon, low temperature polysilicon, and sequential lateral solidification silicon TFTs. An insulation layer 49 is formed over the pixel drivers 45, but does not cover the driver contacts 451. The substrate 52 includes an alignment structure 47, which, in one embodiment, may be combined with the alignment structure 48 of the organic panel 30 to align the two panels 30 and 50. The alignment structure 47 as illustrated includes v-grooves.

Figure 4:
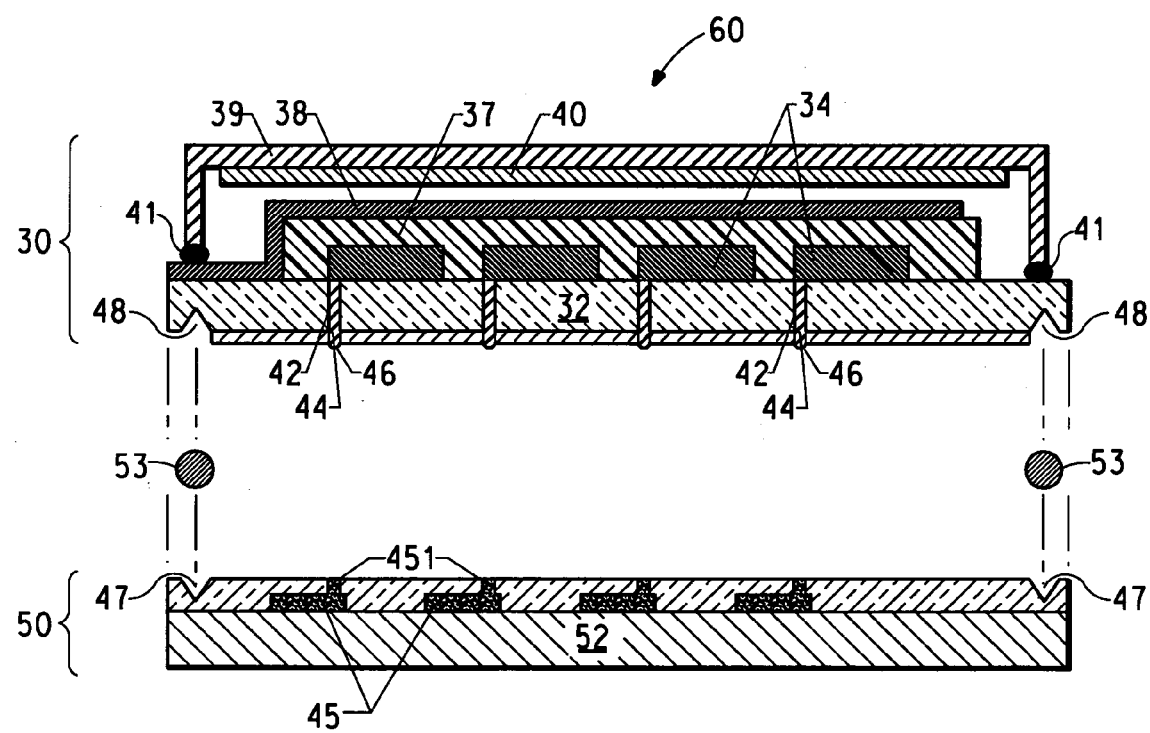
FIG. 4 is a schematic cross-sectional view of an embodiment of a display panel including the organic panel of FIG. 2 and the driver panel of FIG. 3.

FIG. 4 is a schematic cross-sectional view of an embodiment of a display panel 60 including the organic panel 30 of FIG. 2 and the driver panel 50 of FIG. 3. The organic panel 30 is aligned with the driver panel 50 by placing an elongated structure 53 (e.g., an optical fiber, a rod-shaped object) in the v-grooves for one of the panels, and positioning the other set of v-grooves from the other panel over the elongated structure 53 to sandwich the elongated structure 53 between the v-grooves 47, 48. In this embodiment, the v-grooves 47, 48 extend along the edges of the platform 32 and the substrate 52. The contact pads 46 are located so that when the organic panel 30 and the driver panel 50 are positioned relative to each other by using the alignment structures 47, 48, the contact pads 46 become electrically coupled with the pixel drivers 45 through the driver contacts 451. Signals from the pixel drivers 45 are transmitted to the organic active layer 37 through the conductive material 44 in the vias 42. In an embodiment where the organic active layer 37 includes an optically responsive material, the organic active layer 37 emits light in response to the signals from the pixel drivers 45. Alternatively, the organic active layer may generate an electrical signal in response to the light impinging thereon.

The edges of the panels 30 and 50 may be sealed to securely hold the organic panel 30 and the driver panel 50 together. One example of a suitable sealant that is usable for the display panel 60 is epoxy, although other suitable and also removable sealants may be used.

Figure 5:
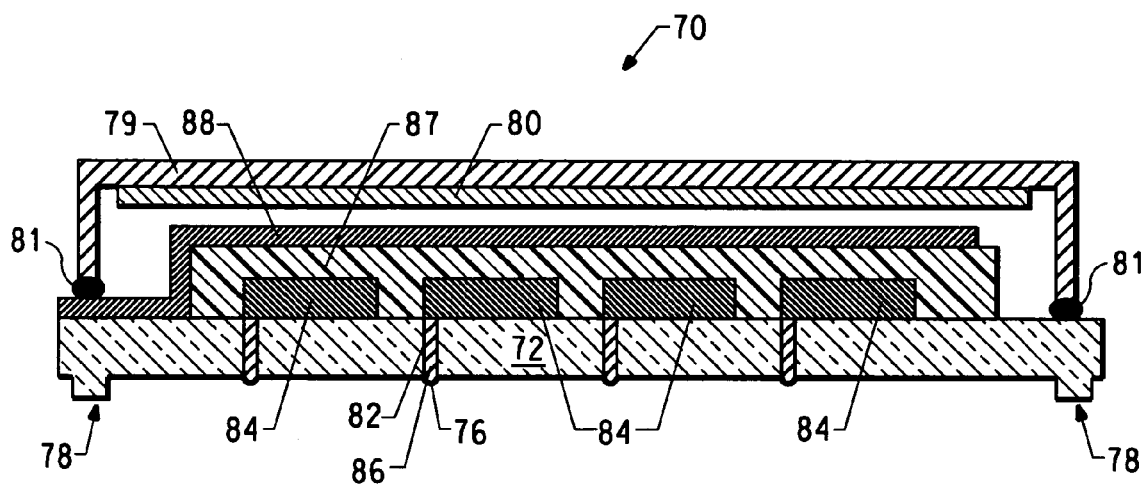
FIG. 5 is a schematic cross-sectional view of an embodiment of an organic panel.

FIG. 5 is a schematic cross-sectional view of another embodiment of an organic panel. Organic panel 70 includes a platform 72 and first electrodes 84 formed on the platform 72. First electrodes 84 may be made of a transparent material, such as ITO, if the organic panel 70 is configured for permitting the passage of light therethrough. An organic active layer 87 and a second electrode 88 are deposited over the first electrodes 84. An encapsulation cap 79 with a layer of getter 80 are placed over the second electrode 88 to protect the layers from various environmental elements and attached using a sealant 81.

Still referring to FIG. 5, platform 72 has vias 82 formed therein. A conductive material 86 fills the vias 82 and forms contact pads 76. The contact pads 76 may be solder bumps or any other suitable conductive surface. The platform 72 includes an alignment structure 78, which may be protrusions as in FIG. 5.

Figure 6:
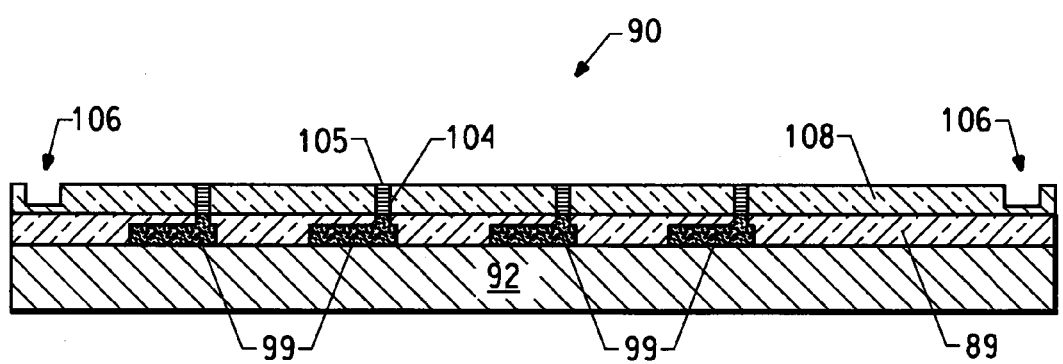
FIG. 6 is a schematic cross-sectional view of an embodiment of a driver panel.

FIG. 6 is a schematic cross-sectional view of another embodiment of a driver panel 90. In this embodiment, driver panel 90 includes a mating plate 108, in addition to a substrate 92, an array of transistors and other circuit elements that form pixel drivers 99, an insulating layer 89, and an alignment structure 106. The alignment structure 106 is disposed on the mating plate 108. In FIG. 6, the alignment structure 106 includes a recess that substantially corresponds to fit with the protrusions 78 of the organic panel of FIG. 5. The mating plate 108 can be useful for protecting the driver circuits, including the transistors, from environmental elements. This embodiment may be useful when the driver panel 90 is sold as a separate unit to the end user for replacement of a defective driver panel.

The mating plate 108, which may be made of glass, has vias 104 extending through it. The vias 104 are filled with a conductive material 105, such as metal. The number of vias 104 of the mating plate 108 corresponds to the number of vias 82 in the platform 72. The positions of the vias 104 and 82 are selected so that the vias are substantially aligned upon assembly of the organic panel 70 and the driver panel 90 with alignment structures 78 and 106. Although the mating plate 108 includes recesses 106 as exemplary alignment structures, other forms of alignment structures (e.g., v-grooves, protrusions, and fiducials) may suitably be used with the mating plate 108.

Figure 7:
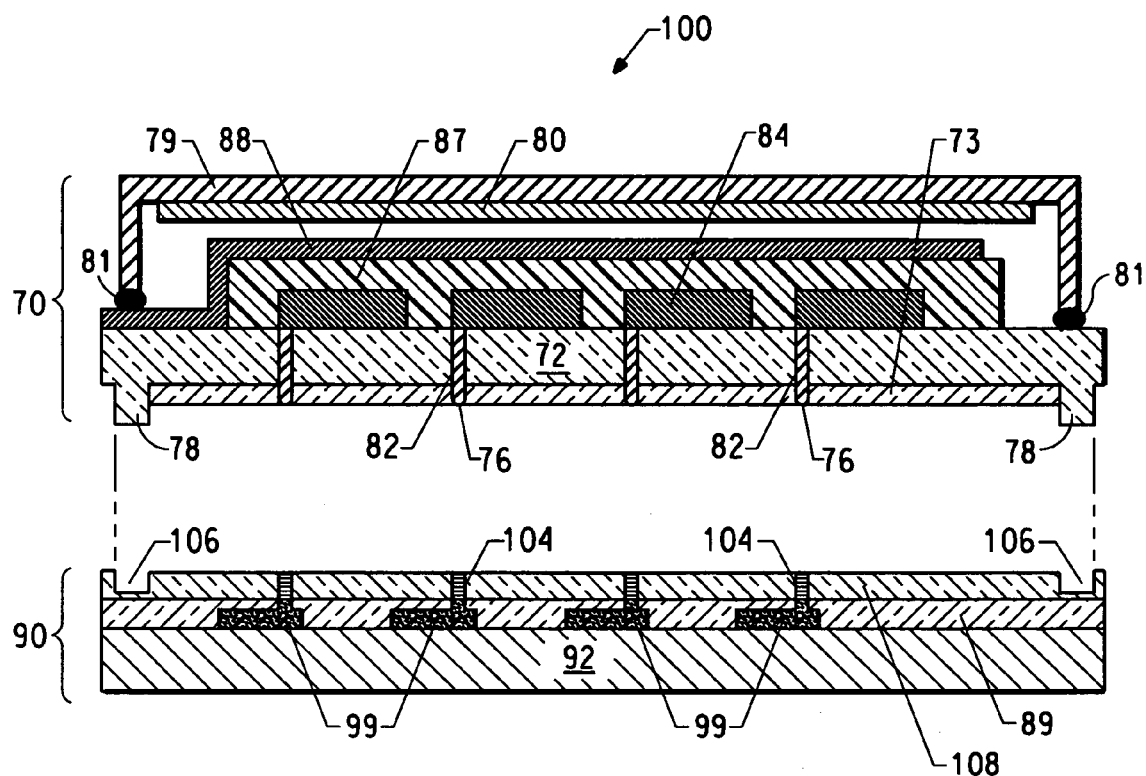
FIG. 7 is a schematic cross-sectional view of an embodiment of a display panel including the organic panel of FIG. 5 and the driver panel of FIG. 6.

FIG. 7 is a schematic cross-sectional view of another embodiment of a display panel 100 including the organic panel 70 of FIG. 5 and the driver panel 90 of FIG. 6. The organic panel 70 is aligned with the driver panel 90 by placing protrusions 78 into the recesses 106. The protrusions 78 may be pins located near the edges of the substrate surface or sidewalls that extend along the edges of the substrate. The recesses 106 may be in the shape of holes or take another form of any other selected cutaway portions located near the edges of the substrate surface, or may take the form of slits extending along the substrate edges. Upon alignment of the two panels 70 and 90, the contact pads 76 are electrically coupled to the pixel drivers 99 through vias 82 and 104. Electrical signals travel from the driving panel 90 to the organic panel 70 through vias 82 and 104.

The alignment structures 78 and 106 can be interchanged. For example, in one embodiment, the organic panel 70 includes recesses and the driver panel 90 includes protrusions. In another embodiment, protrusions 78 and recesses 106 may also be used without a mating plate 108 in which the recesses 106 may be formed on the substrate 92 to be mated with the protrusions 78, the length of the protrusions 78 being adjusted to correspondingly fit into the recesses 106.

Referring to FIGS. 4 and 7, the display panel 60 or 100 may include a view enhancing sheet 43 or 73 positioned between the organic panel 30 or 70 and the driver panel 50 or 90. The view enhancing sheet 43 or 73 may be an optical polarizer, a light-absorbing layer, a low-reflectivity, a black layer, or any combination thereof, and is patterned to prevent interference with the electrical circuit formed in each pixel or subpixel. The view enhancing sheet 43, 73 may be laminated or deposited on the surface of the platform 32, 72 positioned closest to the driving panel 50, 90. Alternatively, the view enhancing sheet may be a separate piece that is positioned and pressed between two panels. The view enhancing sheet 43 or 73 may be used to improve contrast with ambient light, improve optical outcoupling (i.e. luminance or brightness), improve color purity, or any combination thereof. Materials and thicknesses of the view enhancing sheet 43 or 73 are more fully described in U.S. patent application Ser. No. 10/840,807 entitled "Array Comprising Organic Electronic Devices With a Black Lattice and Process For Forming the Same" by Gang Yu et al. filed May 7, 2004.

Figure 8:
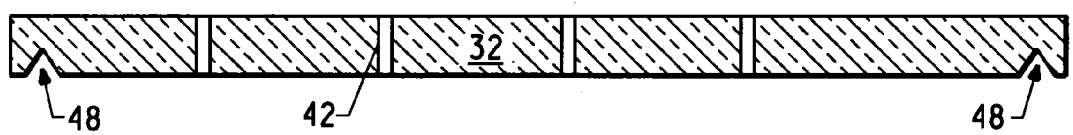
FIGS. 8–12 are schematic views of a method for making the organic panel of FIG. 2.
Figure 9:
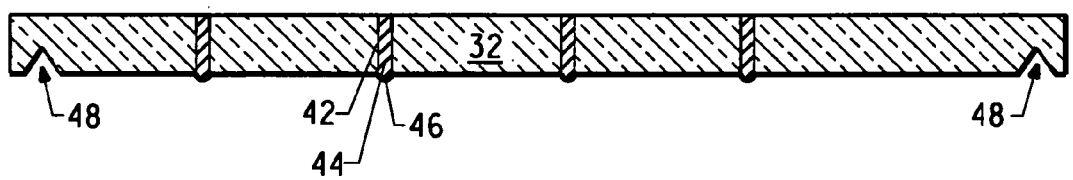
Figure 10:
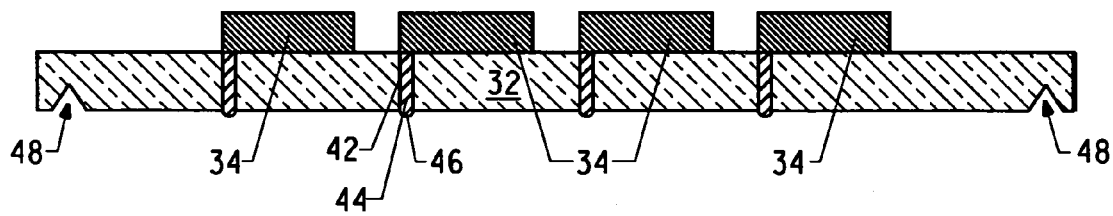
Figure 11:
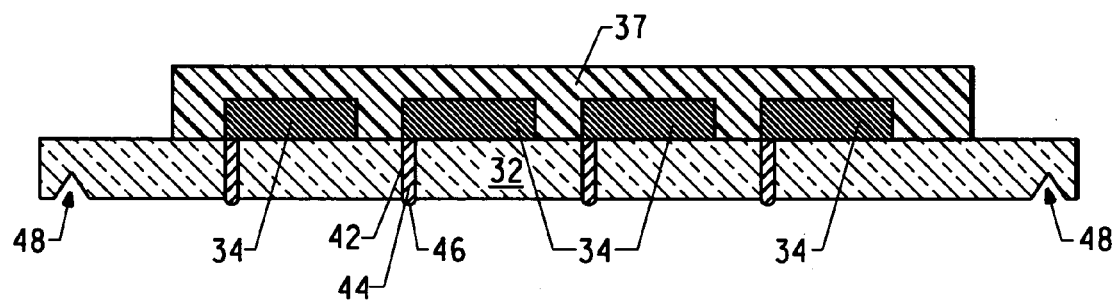

FIGS. 8, 9, 10, 11, and 12 schematically illustrate a method of making the organic panel 30 of FIG. 2. In FIG. 8, the vias 42 and alignment structures 48 are formed in the platform 32, for example, by etching. In FIG. 9, the vias 42 are filled with conductive material 44 and the contact pads 46 are formed. In FIG. 10, first electrodes 34 are formed on a surface of the platform 32 opposite the surface containing the contact pads 46. In FIG. 11, the organic active layer 37 is deposited on the first electrodes 34, along with optional buffer layers, charge-injection layers, charge-transport layers, charge-blocking layers, or any combination thereof. The optional buffer layer, charge-injection layer, charge-transport layer, charge-blocking layer, or any combination thereof may lie at a location between the organic active layer 37 and the first electrodes 34, between the organic active layer 37 and a subsequently-formed second electrode, or a combination thereof. In one embodiment, a hole-transport layer lies between the first electrodes 34 and the organic active layer 37.

The formation of the organic layers is performed using any one or more conventional deposition techniques used in forming organic layers in OLEDs. In one embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer typically has a thickness in a range of approximately 50 to 250 nm.

The organic active layer 37 can include one or more small molecule materials, one or more polymeric materials, or a combination thereof. Small molecule materials may include those described in, for example, U.S. Pat. Nos 4,356,429 and 4,539,507. Alternatively, polymeric materials may include those described in U.S. Pat. Nos 5,247,190, 5,408,109, and 5,317,169. An exemplary material is a semiconducting conjugated polymer. An example of such a polymer is poly (phenylenevinylene) referred to as "PPV." The light-emitting material may be dispersed in a matrix of another material, with or without an additive, but typically forms a layer alone. In one embodiment, the organic active layer 37 generally has a thickness in the range of approximately 40 to 100 nm.

When the organic active layer 37 is incorporated into a radiation-receiving electronic device, the material(s) of the organic active layer 37 may include one or more conjugated polymers, one or more electroluminescent materials, or a combination thereof. Such materials include for example, many conjugated polymers and electro- and photo-luminescent materials. A specific example includes poly(2-methoxy, 5-(2-ethyl-hexyloxy)-1,4-phenylene vinylene) ("MEH-PPV") or a MEH-PPV composite with CN-PPV. The organic active layer 37 typically has a thickness in a range of approximately 50 to 500 nm.

Figure 12:
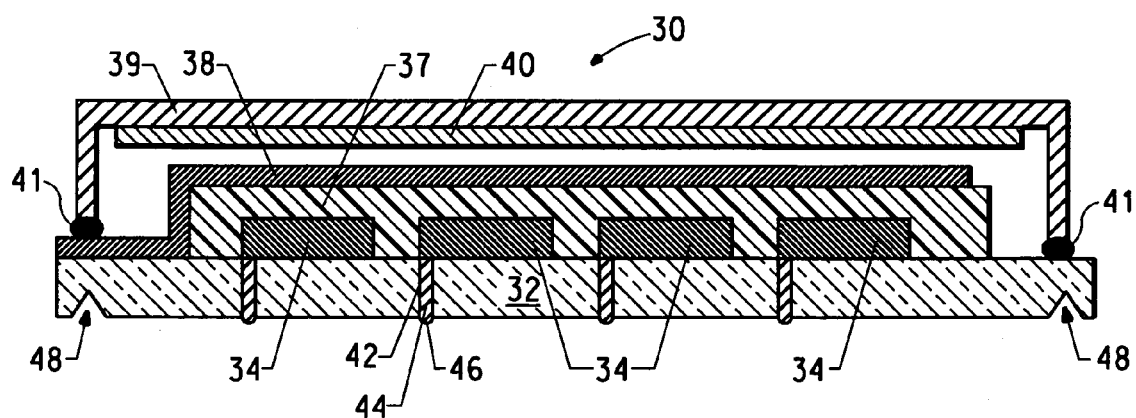

The second electrode 38 is deposited on the organic active layer 37, and an encapsulating layer 39 with a layer of getter 40 is positioned over the second electrode 38, as in FIG. 12, and attached using a sealant 41. In one embodiment, the second electrode 38, acting as a cathode, can include a metal-containing layer having a low work function, which is lower than the first electrodes 34 that have a high work function. A material for the second electrode 38 can include one or more Group 1 metals (e.g., Li, Cs), one or more Group 2 (alkaline earth) metals, one or more rare earth metals, including the lanthanides and the actinides, a metal fluoride (e.g., LiF, CaF, etc.) or any combination thereof. The second electrode 38 can include a conductive capping layer that is less reactive with water and moisture compared to another layer within the second electrode 38 that lies closer to the organic active layer 37. Such capping layer can include a metal or metal alloy, such as Al, Cu, Ag, Au, Pt, Pd, other suitable metal, or any combination thereof. The second electrodes 38 has a thickness in a range of approximately 300 to 600 nm. In one specific, non-limiting embodiment, a Ba layer of less than approximately 10 nm followed by an Al layer of approximately 500 nm may be deposited. A stencil mask corresponding to the pattern of the second electrode 38 can be used with a conventional deposition process, such as evaporation, sputtering, or the like.

Figure 13:
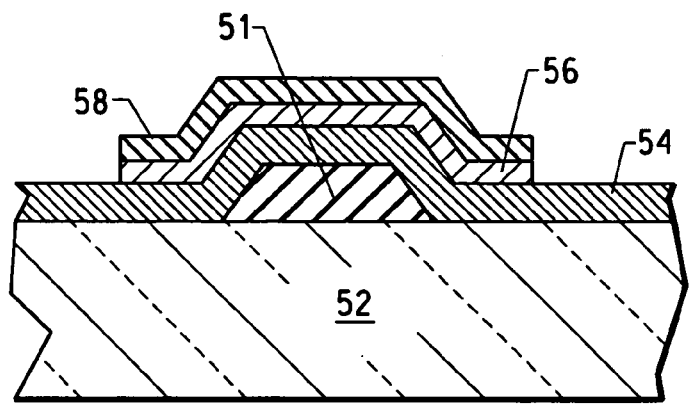
FIGS. 13–15 are schematic views of a method for making the driver panel of FIG. 3.
Figure 14:
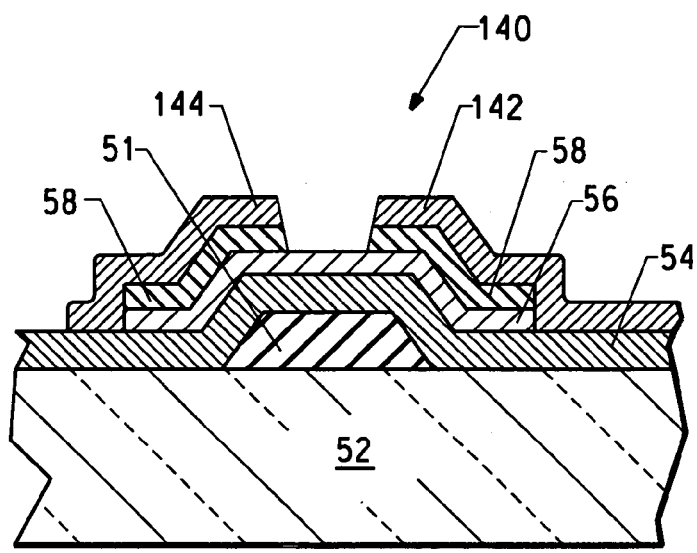
Figure 15:
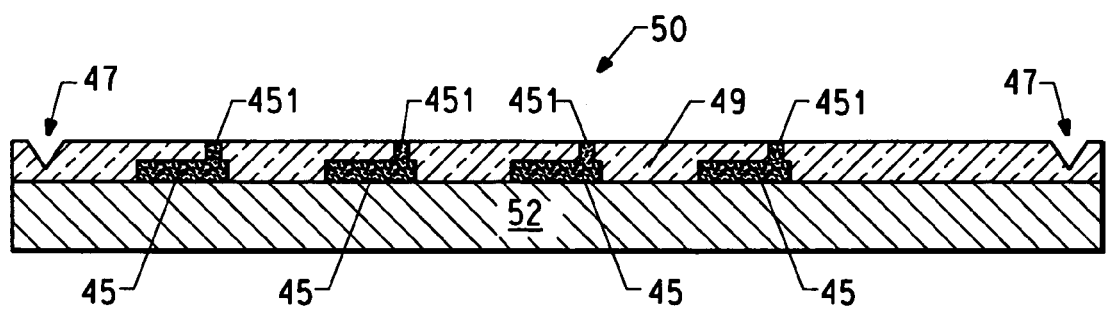

FIG. 13 through FIG. 15 are schematic illustrations of the method for making transistors for the driver panel 50. The alignment structure 47 (not illustrated) is formed in the substrate 52, for example, by etching. Gate electrode 51 is formed over the substrate 52, as illustrated in FIG. 13. The gate electrode 51 can be formed using a conventional deposition and optional patterning sequence. For example, the gate electrode 51 can be deposited as patterned layers using a stencil mask, or deposited over the entire substrate 52 and patterned using a conventional lithographic process. After reading the specification, skilled artisans will appreciate that many other techniques may be used in forming the gate electrode 51.

The gate electrode 51 may include one or more layers that include at least one element selected from Groups 4 to 6, 8 and 10 to 14 of the Periodic Table, or any combination thereof. In one embodiment, the gate electrode 51 can include Cu, Al, Ag, Au, Mo, or any combination thereof. In another embodiment, where the gate electrode 51 includes more than one layer, one of the layers can include can include Cu, Al, Ag, Au, Mo, or any combination thereof and another layer can include Mo, Cr, Ti, Ru, Ta, W, Si, or any combination thereof. Note that conductive metal oxide(s), conductive metal nitride(s), or a combination thereof may be used in place of or in conjunction with any of the elemental metals or alloys thereof. In one embodiment, the gate electrode 51 has a thickness in a range of approximately 100 to 500 nm.

A gate dielectric layer 54, a first semiconductor layer 56, and a second semiconductor layer 58 are sequentially formed over the substrate 52 and the gate electrode 51. Each of the gate dielectric layer 54, the first semiconductor layer 56, and the second semiconductor layer 58 can be formed using conventional deposition techniques.

The gate dielectric layer 54 can include one or more layers including silicon dioxide, alumina, hafnium oxide, silicon nitride, aluminum nitride, silicon oxynitride, another conventional gate dielectric material as used in the semiconductor arts, or any combination thereof. In another embodiment, the thickness of the gate dielectric layer 54 is in a range of approximately 10 to 200 nm.

Each of the first and second semiconductor layers 56 and 58 can include one or more materials conventionally used as semiconductors in electronic components. In one embodiment, the first semiconductor layer 56, the second semiconductor layer 58, or both are formed (e.g., deposited) as amorphous silicon (a-Si), low-temperature polysilicon (LTPS), continuous grain silicon (CGS), or any combination thereof. In another embodiment, other Group 14 elements (e.g., carbon, germanium), by themselves or in combination (with or without silicon), may be used for the first semiconductor layer 56, the second semiconductor layer 58, or both. In still other embodiments, the first and second semiconductor layers 56 and 58 include III–V (Group 13–Group 15) semiconductors (e.g., GaAs, InP, GaAlAs, etc.), II–VI (Group 2–Group 16 or Group 12–Group 16) semiconductors (e.g., CdTe, CdSe, CdZnTe, ZnSe, ZnTe, etc.), or any combination thereof.

In one embodiment, the first semiconductor layer 56 includes silicon as the only semiconductor material, and the second semiconductor layer 58 includes Ge, silicon germanium ("SiGe"), silicon carbide ("SiC") or another semiconductor material different from silicon alone or mixed with silicon. The significance of the different materials within the first and second semiconductor layers 56 and 58 will become apparent later in this specification during a patterning sequence.

The first semiconductor layer 56 is undoped or doped with, for example, a p-type dopant, at a concentration no greater than approximately $1 \times 10^{18}$ atoms/cm$^3$. The second semiconductor layer 58 includes an n-type or p-type dopant at a concentration greater than the first semiconductor layer 56. In one embodiment, the second semiconductor layer 58 is n$^+$ or p$^+$ doped in order to form ohmic contacts with subsequently formed metal-containing structures. In another embodiment, the dopant concentration within the second semiconductor layer 58 is less than $1 \times 10^{19}$ atoms/cm$^3$ and Schottky contacts would be formed when contacted with subsequently formed metal-containing structures. Conventional n-type dopants (phosphorous, arsenic, antimony, etc.) or p-type dopant (boron, gallium, aluminum, etc.) can be used. Such dopants can be incorporated during deposition or added during a separate doping sequence (e.g., implanting and annealing). The first and second semiconductor layers 56 and 58 are formed using conventional deposition and doping techniques. In one embodiment, the thickness of the first semiconductor layer 56 is in a range of approximately 100 to 250 nm, and the thickness of the second semiconductor layer 58 is in a range of approximately 10 to 100 nm. After reading this specification, skilled artisans will appreciate that other thicknesses may be used to achieve the desired electronic characteristics of the transistors.

The first and second semiconductor layers 56 and 58 are patterned using a conventional lithographic technique. Note that the first and second semiconductor layers 56 and 58 are coterminous at each of the edges. In another embodiment, the first and second semiconductor layers 56 and 58 are deposited as patterned layers using a stencil mask to form the patterned first and second semiconductor layers 56 and 58 as illustrated in FIG. 13.

First and second conductive members 142 and 144 are formed over portions of the gate dielectric layer 124 and the first and second semiconductor layers 56 and 58, as illustrated in FIG. 14. Portions of the first conductive member 142 forms the contact for a first electrode 34. The first conductive member 142 is a source contact structure that connect the first electrode 34 to the source region of the transistor 140, and the second conductive member 144 is a drain contact structure that is connected to the $V_{DD}$ power supply line.

The first and second conductive members 142 and 144 can be formed using a conventional technique. In one embodiment, a stencil mask may be used during a deposition operation to form the first and second conductive members 142 and 144. In another embodiment, the first and second conductive members 142 and 144 are formed by depositing one or more layers over substantially all of the substrate 52 and using a conventional lithographic technique to pattern the layer(s). Any of the materials and thicknesses described with respect to the gate electrode 51 may be used for the first and second conductive members 142 and 144.

An exposed portions of the second semiconductor layer 58 lying between the first and second conductive members 142 and 144 is removed using a conventional etching technique. In this embodiment, the first and second conductive members 142 and 144 are part of a hard mask used when removing the exposed portion of the second semiconductor layer 58. Therefore, the channel region for the transistor 140 is self-aligned to the first and second conductive members 142 and 144. The etch may be performed using a wet or dry etch technique. In one embodiment, the etchants used allow the second semiconductor layer 58 to be removed selectively (i.e., etch at a higher rate) with respect to the first and second conductive members 142 and 144.

In one embodiment, a halogen-containing plasma may be used by performing a dry etching technique to remove the exposed portion of the second semiconductor layer 58. The feed gas can include a halogen-containing gas, such as a fluorine-containing gas. The halogen-containing gas can be a fluorocarbon having a formula $C_aF_bH_c$, wherein a is 1 or 2, b is at least one, and b+c is 4 if a is 1 and b+c is 4 or 6 if a is 2. In another embodiment, the fluorine-containing gas can include $F_2$, HF, $SF_6$, $NF_3$, a fluorine-containing interhalogen (CIF, $CIF_3$, $CIF_5$, $BrF_3$, $BrF_5$, and $IF_5$), or any mixture thereof. In another embodiment, the halogen-containing gas is a chlorine-containing gas including $Cl_2$, HCl, $BCl_3$, a chlorine-containing interhalogen (CIF, $CIF_3$, and $CIF_5$), or any mixture thereof. In still another embodiment, the halogen-containing gas is a bromine-containing gas including $Br_2$, HBr, $BBr_3$, a bromine-containing interhalogen ($BrF_3$ and $BrF_5$), or any mixture thereof. In yet another embodiment, the halogen-containing gas is an iodine-containing gas including $I_2$, HI, or any mixture thereof. In still a further embodiment, the halogen-containing gas is any mixture of gases described in this paragraph.

The feed gas can include any one or more oxygen-containing gases, such as of $O_2$, $O_3$, $N_2O$, or other oxygen-containing gas conventionally used for creating an oxygen plasma within the semiconductor arts. The feed gas can also include one or more inert gases (e.g., a noble gas, $N_2$, $CO_2$, or any combination thereof).

The etch can be performed within an etch chamber. During the etch, the pressure is in a range of approximately 0.01 to 5000 mTorr. At these pressures, the feed gas(es) may flow at a rate in a range of approximately 10 to 1000 standard cubic centimeters per minute ("sccm"). In another embodiment, the pressure may be in a range of approximately 100 to 500 mTorr, and the feed gas(es) may flow at a rate in a range of approximately 100 to 500 sccm. The voltage and power may be applied to generate a plasma. Power is typically a linear or near linear function of the surface area of the substrate. Therefore, power densities (in power per unit area of substrate) are given. The voltage is in a range of approximately 10 to 1000 V, and the power density is in a range of approximately 10 to 5000 $mW/cm^2$. In one embodiment, the voltage may be in a range of approximately 20 to 300 V, and the power density may be in a range of approximately 50 to 500 $mW/cm^2$.

The etch may be performed as a timed etch or using endpoint detection with a timed overetch. If the first and second semiconductor layers 56 and 58 are mostly silicon, a timed etch may be used. If dissimilar materials are used for the first and second semiconductor layers 56 and 58, endpoint detection may be used. For example, in one embodiment, if the second semiconductor layer 58 includes silicon germanium, endpoint detection may be based on the absence of germanium in the effluent from the etch chamber after the first semiconductor layer 56 becomes exposed. In another embodiment, if the second semiconductor layer 58 includes germanium with nearly no silicon, endpoint detection may be based on the presence of silicon within the effluent from the etch chamber after the first semiconductor layer 56 is exposed. A timed overetch may be used to ensure that portions of the second semiconductor layer 58 are removed from areas of the substrate 600 where etching occurs more slowly. In one embodiment, the power density during the etch may be decreased during the overetch to improve selectivity of the second semiconductor layer 58 to the first semiconductor layer 56 and other portions of the electronic device exposed to the etching plasma.

Wet chemical etchants selected will be based in part on the composition of the second semiconductor layer 58 and other portions of the electronic device exposed during the etch. In one embodiment, the etchant can include a base (e.g., KOH, tetramethyl ammonium hydroxide, etc.) or a combination of an oxidizer (e.g., $HNO_3$) and HF. A timed etch is typically used for wet chemical etching.

After the etching is completed, none or some of the first semiconductor layer 56 may be removed. In one embodiment, no more than approximately 50 nm of the first semiconductor layer 56 is removed. At this point in the process, source regions and drain regions are formed and include remaining portions of the second semiconductor layer 58. The portion of the first semiconductor layer 56 that is no longer covered by the second semiconductor layer 58 is the channel region for the transistor 140, which in one embodiment is a power transistor.

Additional layers (not illustrated) may be formed to complete formation of other transistors, capacitive electronic components, interconnects, or any combination thereof. After reading this specification, skilled artisans will appreciate that many alternatives may exist for materials and order of formation of such additional layers for forming pixel drivers 45.

A insulation layer 49 is formed over the pixel drivers 45, as illustrated in FIG. 15. The insulation layer 49 can include an organic or inorganic material. An exemplary material can include an inorganic oxide, and inorganic nitride, and inorganic oxynitride, an epoxy, other suitable passivating material, or any combination thereof. The insulation layer 49 can be formed using a conventional deposition technique. All of the deposition and removal steps for forming the electronic components of the driver panel 50 are performed without covering or filling the alignment structure 47 with unwanted material.

The alignment structures may be any selected structure or indicator markings suitable for aligning the organic panel with the driver panel, and are not limited to the embodiments described herein. For example, the elongated structure 53 of FIG. 4 includes, but need not have, a circular cross section, but may have any selected shape that is suitable for cooperating with the selected alignment structures of the panels. In addition, the protrusions may include a pin protruding from a panel surface or a peg in a well and the recesses may be any complementary or selectively shaped groove or curve. Another embodiment may include two protrusions, such as dove-tail connectors, that are designed to lock together.

Advantageously, an end user can purchase a replacement panel for a defective panel (the organic panel or the driver panel) off the shelf and replace it without specialized equipment, or may also advantageously purchase a replacement panel requiring precise optical alignment from a manufacturer.

It has been found that defects in organic electronic devices are often localized. As stated above, the current cost of manufacturing and repair is high for organic electronic devices because the entire device is categorized as "defective" even when the defect is localized in a subsection of the device. Advantageously, the interchangeable organic electronic devices disclosed herein reduce the manufacturing and repairing costs by allowing the selective replacement of defective portions of a device. With the inventive electronic device, the defect-free section of the device can continue to be used or recycled.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of invention.

Benefits, other advantages, and solutions to problems have been described above with regard to specific embodiments. However, the benefits, advantages, solutions to problems, and any elements that may cause any benefit, advantage, or solution to occur or become more pronounced are not to be construed as a critical, required, or essential feature or element of any or all the claims.

What is claimed is:

1. An electronic device comprising:
    an organic panel, comprising:
        a platform made of an electrically nonconductive material;
        a first electrode on the platform;
        an organic active layer on the first electrode;
        a second electrode on the organic active layer; and
        a first alignment structure; and
    a driver panel, comprising:
        a substrate;
        a driver circuit formed on the substrate; and
        a second alignment structure for coupling with the first alignment structure, wherein the first and second alignment structures are coupled to position the organic panel and driver panel in substantial alignment, wherein the driver circuit is electrically coupled to the organic active layer.

2. The device of claim 1, wherein the organic panel further comprises:
    a via extending through the platform; and
    an electrically conductive material in the via.

3. The device of claim 1, wherein the platform comprises a view enhancing sheet.

4. The device of claim 1 further comprising a view enhancing sheet positioned between the organic panel and the driver panel.

5. The device of claim 1, wherein the organic panel further comprises:
    a plurality of first electrodes; and
    a plurality of pixels, wherein each of a pixel in the plurality of pixels includes at least two subpixels.

6. The device of claim 1, wherein the driver panel further comprises:
    a mating plate coupled to the driver circuit, comprising a via extending therethrough; and
    an electrically conductive material in the via, wherein the electrically conductive material electrically couples the driver circuit to the organic panel;
    and wherein the second alignment structure is formed on the mating plate.

7. The device of claim 1, wherein the second alignment structure is formed on the substrate.

8. The device of claim 1, wherein each of the first and the second alignment structures comprises one or more of a recess, a groove, a protrusion, and a fiducial.

9. The device of claim 1, wherein the organic panel and the driver panel are substantially in alignment by using a member that cooperates with the first and the second alignment structures to align the organic panel and driver panel.

10. The device of claim 9, wherein the first and the second alignment structures comprise first and second v-grooves, and the member is an elongated structure sandwiched between the first v-groove and the second v-groove.

11. The device of claim 1, wherein the organic active layer emits radiation in response to an electrical signal from the driver circuit.

12. The device of claim 1, wherein the organic active layer generates an electrical signal in response to radiation.

13. An electronic device comprising:
    an organic panel, comprising:
        a platform made of an electrically nonconductive material and having a thickness;
        a first electrode and a second electrode disposed on the platform;
        an organic active layer positioned between the first electrode and the second electrode and capable of receiving current flowing between the first electrode and the second electrode; and
        first vias extending through the thickness of the platform, wherein the first vias are filled with an electrically conductive material that is electrically coupled to the second electrode; and a driver panel removably sealed to the organic panel, comprising:
a substrate; and
a driver circuit formed on the substrate, wherein electrical signals are transmitted from the driver circuit to the organic layer through the first vias filled with the electrically conductive material.

14. The device of claim 13 further comprising:
a mating plate positioned between the platform and the driver circuit;
second vias extending through the mating plate and filled with a conductive material;
a first alignment structure formed on the platform; and
a second alignment structure formed on the mating plate and positioned such that when the first and the second alignment structures are mated, the first vias and the second vias are substantially aligned.

15. An organic panel comprising:
an electrically nonconductive platform having a first surface and a second surface;
a first electrode on the first surface of the platform;
an organic active layer on the first electrode;
a second electrode on the organic active layer;
a via extending through the platform from the first surface to the second surface; and
an alignment structure formed on the platform for positioning a device in substantial alignment with another device.

16. The organic panel of claim 15, wherein the alignment structure is selected from a group consisting of a groove, a protrusion, a recessed area, and a surface marking.

17. The organic panel of claim 15, further comprising an encapsulation layer covering the organic panel.

18. The organic panel of claim 17, wherein the platform is flexible.

19. A driver panel for being mated with an organic member to form an electronic device, the driver panel comprising:
a substrate;
transistors formed on the substrate;
a mating plate coupled to the transistors, the mating plate having vias extending therethrough wherein the positions of the vias substantially correspond to the positions of the transistors and are filled with an electrically conductive material; and
an alignment structure formed on the mating plate.

* * * * *